United States Patent
Gray et al.

(10) Patent No.: US 7,201,853 B2
(45) Date of Patent: Apr. 10, 2007

(54) METHOD FOR MAKING A METAL FORMING STRUCTURE

(75) Inventors: Brian Francis Gray, Wyoming, OH (US); Keith Joseph Stone, Fairfield, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 104 days.

(21) Appl. No.: 10/799,248

(22) Filed: Mar. 12, 2004

(65) Prior Publication Data

US 2004/0188384 A1 Sep. 30, 2004

Related U.S. Application Data

(60) Provisional application No. 60/458,279, filed on Mar. 28, 2003.

(51) Int. Cl.
| | |
|---|---|
| B44C 1/22 | (2006.01) |
| C03C 15/00 | (2006.01) |
| C03C 25/68 | (2006.01) |
| C23F 1/00 | (2006.01) |
| C25C 3/00 | (2006.01) |

(52) U.S. Cl. .............................. 216/103; 216/9; 156/66
(58) Field of Classification Search ................ 216/103, 216/9; 430/5; 156/66
See application file for complete search history.

(56) References Cited

U.S. PATENT DOCUMENTS

| | | | |
|---|---|---|---|
| 2,567,275 A | 9/1951 | Colombo | |
| RE23,910 E | 12/1954 | Smith | |
| 2,854,336 A | 9/1958 | Gutnecht | |
| 2,977,228 A | 3/1961 | Gold et al. | |
| 3,054,148 A | 9/1962 | Zimmerli | |
| 3,247,579 A | 4/1966 | Cattermole | |
| 3,453,712 A | 7/1969 | MacKendrick | |
| 3,613,208 A | 10/1971 | Seberg | |
| 3,674,221 A | 7/1972 | Riemersma | |
| 3,726,732 A | 4/1973 | Richardson et al. | |
| 4,136,615 A * | 1/1979 | Pozniak | ................... 101/401.1 |
| 4,151,240 A | 4/1979 | Lucas | |
| 4,213,819 A | 7/1980 | Werthmann | |
| 4,342,314 A | 8/1982 | Radel | |
| 4,463,045 A | 7/1984 | Ahr | |

(Continued)

OTHER PUBLICATIONS

S. Wolf and R.N. Tauber, (Silicon Processing for the VLSI Era, vol. 1- Process Technology, Lattice Press, 1986)(pp. 522, 524, 562).*

(Continued)

Primary Examiner—Nadine G. Norton
Assistant Examiner—Mahmoud Dahimene
(74) Attorney, Agent, or Firm—Amanda T. Barry; Roddy M. Bullock; David M. Weirich

(57) ABSTRACT

A method for making a forming structure for use in an apparatus for making formed polymeric film. The method comprises a multiple step process of applying a photoresist polymer to a metal base sheet, curing the polymer, acid etching the portions of the metal base sheet not covered by cured polymer to form a protrusion having an upper surface and a side wall (or walls), washing the base sheet with caustic and repeating the process as necessary, each time covering the upper surface and side wall of the protrusion with cured polymer.

6 Claims, 2 Drawing Sheets

U.S. PATENT DOCUMENTS

| | | | |
|---|---|---|---|
| 4,582,566 A | | 4/1986 | Grey |
| 4,601,868 A | | 7/1986 | Radel |
| 4,609,518 A | | 9/1986 | Curro |
| 4,629,643 A | | 12/1986 | Curro |
| 4,778,644 A | | 10/1988 | Curro |
| 5,688,366 A | * | 11/1997 | Ichinose et al. ............ 438/754 |
| 6,061,897 A | | 5/2000 | Shouji et al. |
| 6,361,703 B1 | | 3/2002 | Dickey |
| 2001/0021419 A1 | * | 9/2001 | Luthje et al. ............... 427/421 |
| 2003/0185971 A1 | * | 10/2003 | Saksa et al. .................. 427/96 |
| 2004/0077178 A1 | * | 4/2004 | Yang et al. ................. 438/710 |

OTHER PUBLICATIONS

Haisma J. et al. "Mold-Assisted Nanolithography: A Process for Reliable Pattern Replication" Journal of Vacuum Science and Technology: Part B, American Institute of Physics. New York, US, vol. 14, No. 6, Nov. 1, 1996, pp. 4124-4128, ISSN: 1071-1023; Chapter II, Part B; Chapter IV.

* cited by examiner

METHOD FOR MAKING A METAL FORMING STRUCTURE

CROSS REFERENCE TO RELATED APPLICATIONS

This application claims the benefit of U.S. Provisional Application No. 60/458,279, filed Mar. 28, 2003.

FIELD OF THE INVENTION

The present invention relates to method for making a metal forming structure for making polymeric webs exhibiting three-dimensional surface aberrations. More particularly, the present invention relates to method for making a metal forming structure having protrusions having an aspect ratio greater than about 1.

BACKGROUND OF THE INVENTION

Apparatuses comprising various means for unwinding, forwarding, debossing or embossing, and/or perforating, and rewinding of a ribbon or web of thermoplastic film are disclosed in the prior art: see for instance, U.S. Pat. No. Re. 23,910, Method of And Apparatus For Producing Textured Films which issued Dec. 14, 1954 to L. H. Smith et al.; U.S. Pat. No. 3,054,148, Process Of Producing A Perforated Thermoplastic Sheet which issued Sep. 18, 1962 to W. F. Zimmerli; and U.S. Pat. No. 2,567,275, Apparatus And Method Of Goffering Thermoplastic-tic Materials which issued Sep. 11, 1951 to R. Colombo. See also U.S. Pat. No. 3,674,221, Dynamic Stress-Strain Testing Of Ribbons Of Film which issued Jul. 4, 1972 to Coenraad E. Riemersma.

The prior art also discloses various methods of making perforated members: see for instance U.S. Pat. No. 3,453,712, Method Of Making A Porous Roll which issued Jul. 8, 1969 to R. G. MacKendrick; U.S. Pat. No. 3,613,208, Method Of Fabricating A Perforated Panel For A Vacuum Work-Holder Or Chuck which issued Oct. 19, 1971 to H. A. Seberg et al.; and U.S. Pat. No. 3,247,579, Circuit Fabrication Method which issued Apr. 26, 1966 to L. H. Cattermole et al.

Methods and apparatuses for imparting a three-dimensional polymeric web having improved tactile impression are disclosed in U.S. Pat. No. 4,151,240, Method for Debossing and Perforating a Running Ribbon of Thermoplastic Film, which issued Apr. 24, 1979 to Lucas et al.; and U.S. Pat. No. 4,601,868, Method of Imparting a Three-Dimensional Fiber-Like Appearance and Tactile Impression to a Running Ribbon of Thermoplastic Film, which issued Jul. 22, 1986 to Radel et al. and U.S. Pat. No. 4,342,314, issued to Radel et al.

Other methods and apparatuses have been disclosed for making polymeric webs exhibiting a soft and silky tactile impression. For example, U.S. Pat. No. 4,609,518 and U.S. Pat. No. 4,629,643, each issued to Curro et al., and issued Sep. 2, 1986, and Dec. 16, 1986, respectively, disclose an apparatus for forming a polymeric web having large apertures and a plurality of fine-scale apertures.

The above-mentioned references are representative of various methods and apparatuses for embossing or debossing polymeric films on a supporting framework, often termed a forming structure or screen. In particular, many of these references disclose the use of cylindrical metal screens comprising an interconnecting network defining a plurality of apertures to which a polymeric film can conform when impinged upon by a fluid such as jets of water or heated air. The plurality of apertures provides for a relatively high open area through the screen through which water, for example, can pass through. One example of the use of such screens for the application of high pressure liquid jet or stream to a web of polymeric film is disclosed in U.S. Pat. No. 4,778,644, issued to Curro et al., and issued Oct. 18, 1988.

Metal forming structures, e.g., screens, of the type disclosed above in Radel et al. '314 can have surface aberrations on one surface thereof, as described in U.S. Pat. No. 4,463,045, issued Jul. 31, 1984 to Ahr et al. Ahr et al. discloses that the surface aberrations, or protuberances on a metal forming structure can be formed by a photoetching process involving the application of a resist coating that corresponds to the desired pattern of surface aberrations. Surface aberrations on a polymer film made on such a forming structure are disclosed as providing desirable tactile impression to a user.

The surface aberrations of the polymeric web disclosed in Ahr et al. '045 are taught as having an amplitude, i.e., a height, of at least about 0.2 mils (0.0002 inches) and at least about 0.3 mils (0.0003 inches). It is believed that having generally columnar, pillar-like surface aberrations on a metal forming structure having an amplitude of between about 1 mil (about 0.001 inch, about 25.4 mm) and 10 mils (about 0.010 inches, about 255 mm) would provide for a polymer web having much better tactile impression to a user. In particular, surface aberrations having such amplitudes in combination with cross-sectional dimensions resulting in an aspect ratio (amplitude/diameter) of between about 1 and 3 would produce a particularly soft-feeling polymeric web.

Attempts to make surface aberrations having significantly higher amplitudes on metal forming structures such as those described in Ahr '045 have been unsuccessful due to the inherent limitations of known photoetching processes. That is, after a resist coating is applied, photoetching, if given sufficient time, tends to etch away material around the surface aberrations indiscriminately, resulting in protrusions having a generally "mushroom-shaped" profile. Eventually, due to the undercutting effect of the photoetching, the base of the surface aberration can be completely etched away. If polymeric webs were to be formed over such a forming structure it is believed that they would be difficult to remove from the forming structure due to the mushroom-shaped protrusions.

Accordingly, there is a need for an improved metal forming structure useful for making three-dimensional formed film webs, such as for use as a topsheet in disposable absorbent articles.

Additionally, there is a need for a method of making improved metal forming structures having surface aberrations having relatively high aspect ratios.

SUMMARY OF THE INVENTION

A method for making a forming structure for use in an apparatus for making formed polymeric film is disclosed. The method comprises:
  a. providing a metal base sheet;
  b. providing an uncured photoresist polymer;
  c. providing a mask sheet having light transparent regions;
  d. providing a light curing means;
  e. providing an acid for etching;
  f. providing a caustic (optional; could be eliminated or use water);
  g. applying a continuous layer of uncured photoresist polymer to one surface of the metal base sheet;

h. disposing the mask sheet between the continuous layer of uncured photoresist polymer and the light curing means;
i. exposing the photoresist polymer through the mask means to cure the portions of the photoresist polymer in register with the transparent regions;
j. removing the mask sheet;
k. exposing the base sheet to acid for a sufficient time to define at least one protrusion having an upper surface and a side wall defining a first height on the base sheet;
l. washing away the acid with the caustic (or water, if either is used);
m. applying photoresist polymer to the upper surface and a side wall of the at least one protrusion;
n. exposing the base sheet to acid for a sufficient time to form additional side wall of the at least one protrusion such that the side wall defines a second height, the second height being greater than the first height; and
o. washing away the acid with caustic.

BRIEF DESCRIPTION OF THE DRAWING

While the specification concludes with claims particularly pointing out and distinctly claiming the subject matter of the present invention, it is believed that the invention will be better understood from the following description taken in conjunction with the accompanying Figures, in which:

DETAILED DESCRIPTION OF THE INVENTION

Figure 1:
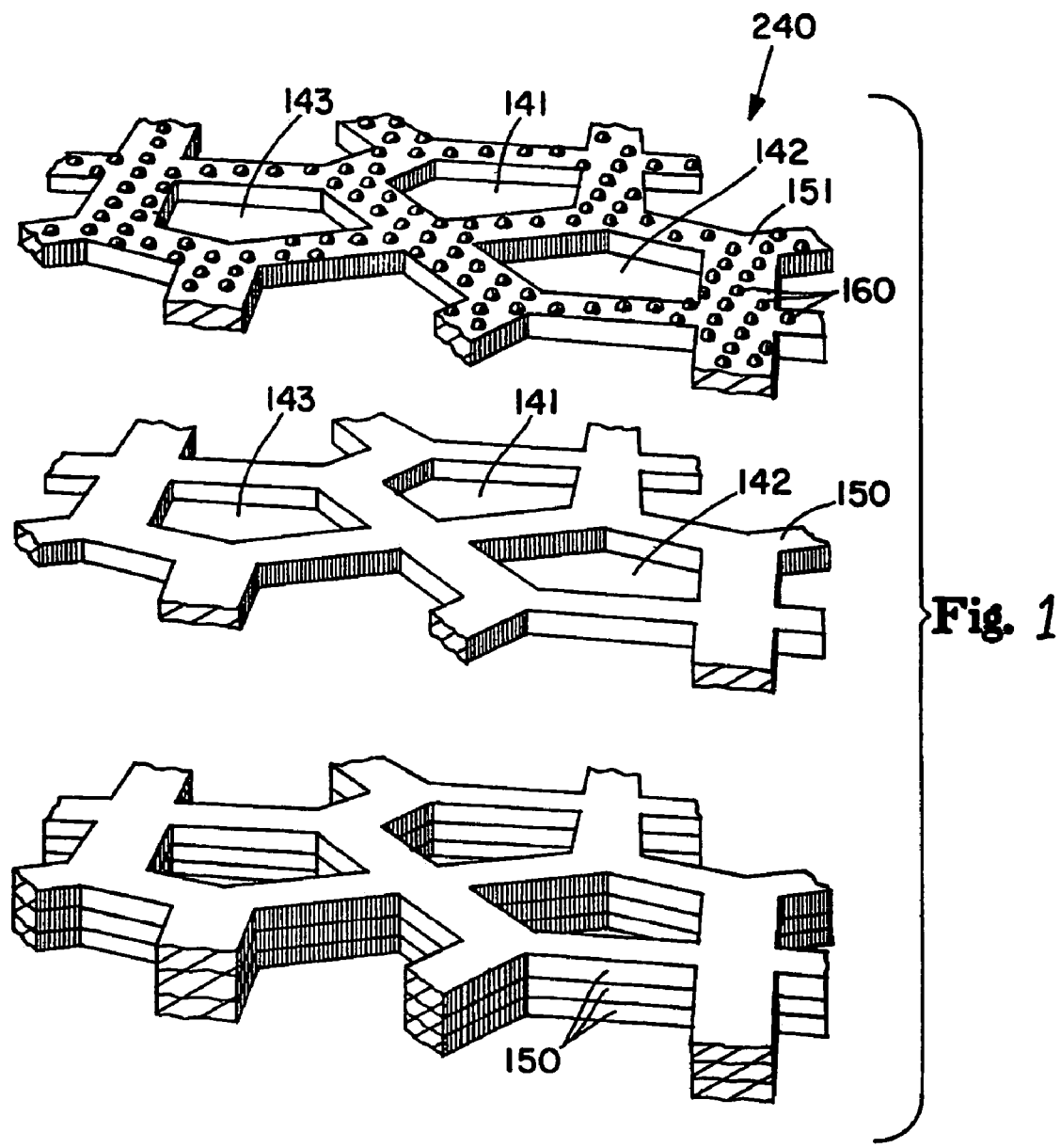
FIG. 1 is a forming structure of the type generally disclosed in U.S. Pat. No. 4,463,045.

FIG. 1 shows a representative forming structure of the type described in U.S. Pat. No. 4,463,045 (Ahr '045), which is hereby incorporated herein by reference. Briefly, the forming structure shown in FIG. 1, is a simplified embodiment of a particular laminate structure 240 which could, if desired, be utilized to provide a surface suitable for debossing and perforating an initially imperforate, substantially planar plastic web to produce a fluid-pervious macroscopically expanded three-dimensional plastic web exhibiting a fine scale pattern of pentagonally-shaped capillary networks. In practice, the shape of the capillary networks is not critical to the present invention. The laminate structure 240 (shown prior to rolling and seaming into a tubular forming structure, as disclosed in Ahr '045) is comprised of a stack of identically apertured laminae. With the exception of the pattern of surface aberrations 160 present on upper-most lamina 151, laminae 150 and 151 are identical to one another.

In the illustrated embodiment, laminae 150 and 151 are so stacked that the pentagonally-shaped apertures in each successive lamina coincide with one another. Laminae 150 are formed from planar metallic sheets by photoetching techniques well known in the art, as described in the aforementioned patent application of Radel et al. The uppermost surface of lamina 151, which coincides with the visible surface of plastic webs contacting the forming structure, is also photoetched by techniques well known in the art to provide a regularly spaced, microscopic pattern of protuberances, hereinafter generally referred to as surface aberrations 160. This is disclosed in Ahr '045 as being accomplished by applying a resist coating which corresponds to the desired microscopic pattern of surface aberrations to the topside of a planar photoetched lamina 150 (i.e., having experienced a first photoetching process to form the capillary networks), and thereafter initiating a second photoetching process. The second photoetching process produces a lamina 151 having a microscopic pattern of surface aberrations 160 on the interconnected fiber-like elements defining the pentagonally shaped apertures, e.g., apertures 141, 142, 143.

Ahr '045 teaches that in those situations where a more cloth-like or fiber-like tactile impression in the resultant macroscopically expanded three-dimensional plastic web is also desired, it has been found that the protuberances comprising surface aberrations 160 on lamina 151 should preferably exhibit an amplitude, i.e., the perpendicular distance from the top of the surface aberration to the plane in which the aberration originates, that is sufficient to produce an average amplitude of at least about 0.2 mils (i.e., 0.0002 inches) in the resultant plastic web, and most preferably at least about 0.3 mils (i.e., 0.0003 inches).

Ahr '045 further teaches that, in general, the greater the amplitude of the surface aberrations in the resultant plastic web, the more fiber-like said web will feel. However, attempts at actually making a metal forming structure having surface aberrations having a greater amplitude have met with little success. In practice, it has been found that by using known photoresist methods surface aberrations of the type disclosed in Ahr '045 and having an amplitude of greater than about 1.5 mils (about 0.0015 inches, about 38 microns) while retaining an aspect ratio of 1 or more is, in fact, not possible.

The method of the present invention overcomes the problems with prior art methods, such as the known photoresist or photo etching processes disclosed in Ahr '045. In particular, the method of the present invention can make protuberances in metal screens that are generally columnar, pillar-like and having an amplitude of at least about 2 mils (about 0.002 inches, about 50 mm) and an aspect ratio (defined as amplitude divided by the cross-sectional dimension, e.g., diameter for circular cylindrical cross-sections) of at least about 1. In general, the diameter is measured at ½ the height h of protuberances, and can be an average diameter for multiple protuberances having differing diameters. The height can be about 3 mils (about 0.003 inches, about 75 mm), and can be about 4 mils (about 0.004 inches, about 100 mm) or higher.

In essence, the method of the present invention involves application the photoresist techniques and photoetching disclosed in Ahr '045, with the improvement being the application of multiple photoetching steps, each photoetching step being preceded by an application of photoresist material that covers not only the "top" of the protuberance, i.e., the upper surface, or the region of highest amplitude, but also covers the sides of the protuberance, to the base of the protuberance. In this manner, undercutting is eliminated and "mushroom-shaped" protuberances can be avoided. The term "sides" refers to the generally vertically oriented portions of a protuberance when viewed from the side, as shown below with respect to FIGS. 2–4. In general, a protuberance can have any number of sides, but a protuberance having a cylindrically-shaped cross-section only has one side, so that protuberances may be spoken of as have a side, or sides.

Figure 2:
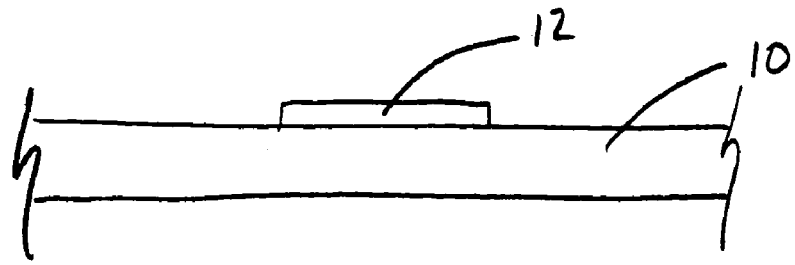
FIGS. 2–5 are schematic representations of the formation of a protrusion by the method of the present invention.
Figure 3:
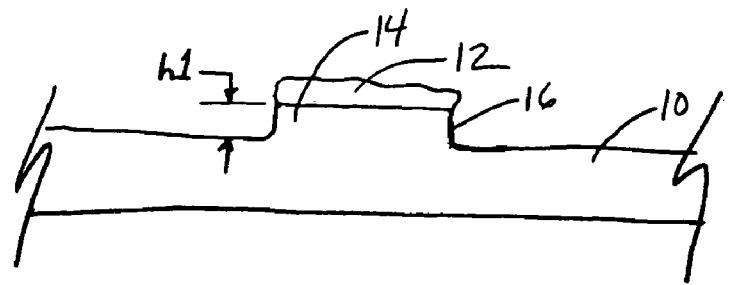
Figure 4:
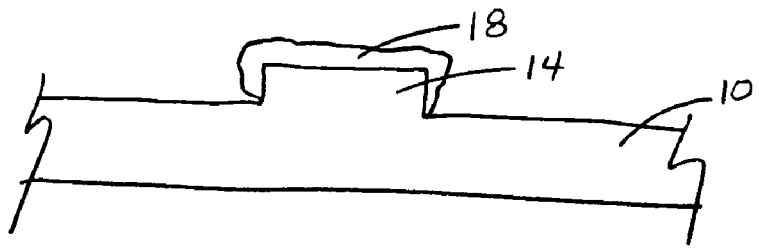

FIGS. 2–4 show simplified cross-sectional views of one protuberance made by the process of the present invention. As shown in FIG. 2, a base, or starting metal sheet 10 is provided. Base sheet 10 can be any metal susceptible to acid etching, e.g., stainless steel, and can be analogous to the upper lamina 151 disclosed above with respect to the lamina of Ahr '045, for example. A photo resist material such as a photo resist polymer can be applied as a continuous layer, masked appropriately, cured and washed to remove uncured resin (all steps as known in the art) to form a cured photoresist portion 12. For generally circular cross-section protuberances cured photoresist portion 12 should be a circular "spot" of material. For making forming structures suitable for making three-dimensional formed film webs having relatively high amplitude, high aspect ratio surface aberrations, it is preferable that a plurality of closely-spaced cured photoresist portions 12 be present on surface of base sheet 10.

In general, as known in the art, the photoresist material can be any of known acid resistant materials, such as light-curable (e.g., light activatable) polymers, waxes or hydrocarbon materials. When a photoresist material is used, it can be an acrylate material, such as an acrylate monomer with a photoinitiator and additives, such as is known in the art. The acid resistant material can be applied initially as a continuous layer, and overlaid with a transparent polymer sheet, e.g., MYLAR, which has been printed with opaque regions such that upon exposure to light activation only the portions of the continuous layer of photoresist polymer in register with transparent portions of the mask are polymerized. Once polymerized, the mask is removed, and the un-polymerized material washed off to leave at least one cured photoresist portion 12 or portions.

The base sheet having a cured photoresist portion 12 as shown in FIG. 2 is then exposed to an acid, e.g., ferrite chloride, which, when left for a sufficient amount of time, etches portions of base sheet 10 in the areas not coated with cured photoresist portions 12, resulting in a raised protuberance 14 having generally vertical side walls 16, as shown in FIG. 3. The actual height, h, of the protuberance 14 having generally vertical side walls 16 is believed to be limited to about 110% of the diameter of cured photoresist portions 12, due to the tendency of the acid to undercut at the base of the protuberance 14. Therefore, in theory, a single step photoresist process can make protuberances 14 having an aspect ratio of about 1. However, as a practical matter, a single step photoresist process can make protuberances 14 having a diameter of about 2 mils with an aspect ratio of less than 1, e.g., about 0.75.

Figure 5:
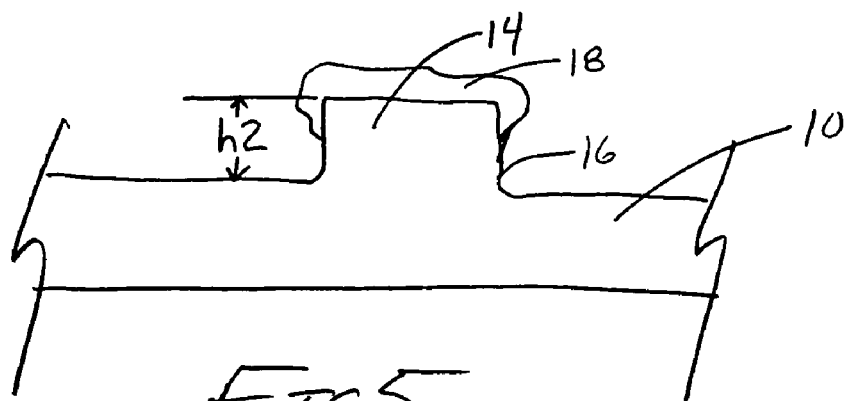

In the method of the present invention greater aspect ratios are obtained by successive reapplications of acid resistant materials, such as photoresist polymers, for example as shown in FIG. 4. A second application of acid resistant material, such as a photoresist polymer, can be applied, e.g., by printing techniques, such that the polymer covers the top and sides of protuberance 14. The base sheet 10 is once again etched via acid etching, optionally washed with water or caustic, resulting in a protuberance 14 having a second height, h2, as shown in FIG. 5. In general, the first application of acid resistant material can also be applied by the printing methods disclosed herein, i.e., the first application need not be restricted to the masking technique disclosed, but individual photoresist portions 12 can be applied via printing methods in all steps of the method.

The process can be repeated as necessary to achieve a desired protuberance height. In general, it is recognized that the sidewalls 16 of protuberance 14 may not be perfectly straight, but may exhibit some amount of waviness, due to undulations formed by the successive acid etching steps. The amount of waviness can be controlled to some extent by minimizing the amount of material removal via acid etching in each step. However, in general the protuberance 14 exhibits an overall shape and orientation such that it has a generally flattened upper surface and the wall(s) 16 is generally orthogonal to, or slightly tapered with respect to, the base sheet 10 such that the diameter of protuberance 14 at the upper surface thereof varies from the diameter near the base thereof and any intermediate diameter by less than about 55%, preferably less than 25% and more preferably less than 10%. By "near the base" is meant at the point where the wall 16 exhibits substantial verticality, and is to be distinguished from a generally rounded, sloping region where the base joins the base sheet 10.

One method of applying photoresist polymer in each successive step is a printing method, such as by a flexographic process. For example, photoresist polymer can be picked up on a fountain roll, transferred to a metering roll, e.g., an anilox roll, finally to a printing cylinder. The base sheet 10 can then be printed between the printing cylinder and an impression cylinder.

The printing cylinder can be fitted with a roll surface having sufficient resiliency and depth to permit coverage of protuberances 14, including the side walls 16 thereof, in each step. After printing the photoresist polymer onto base sheet 10, it can be polymerized prior to the etching step. In addition, the nip clearance between the printing cylinder and impression cylinder can be adjusted as necessary to ensure that photoresist polymer is not transferred onto portions of base sheet 10 in which etching and removal of material is desired.

Once photoresist material is printed on to the protuberance or protuberances 14, the base sheet can be acid etched as described above, and the process can be repeated as necessary to form protrusions having aspect ratios greater than about 1.

Other methods of applying photoresist material between photoetching steps can be utilized, including by hand-application if the protuberance 14 is large enough to be seen and manipulated by hand.

In a preferred method, the first photoetching step is accomplished as known in the art and described above, i.e., by utilization of a continuous layer of photoresist material and a masking sheet to form the first photoresist portions 12, as shown in FIG. 2. Thereafter, in a preferred embodiment, the method of the present invention comprises successive reapplication of photoresist polymer via a printing method sufficient to apply photoresist polymer to, and only to, the tops and sides of protrusions 14. The process can be repeated until the desired height of protrusion 14 is reached.

In a preferred embodiment, photoresist polymers are utilized. However, it is recognized that other acid resistant materials, e.g., waxes and hydrocarbon materials can be utilized, such as heat curable polymers, with appropriate changes made to the curing means, if necessary, such as substituting heat exposure means for light exposure means.

All documents cited in the Detailed Description of the Invention are, are, in relevant part, incorporated herein by reference; the citation of any document is not to be construed as an admission that it is prior art with respect to the present invention.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for making a forming structure, the method comprising:
   a. providing a metal base sheet;

b. providing an uncured photoresist polymer;
c. providing a mask sheet having light transparent regions;
d. providing a light curing means;
e. providing an acid;
f. providing a caustic;
g. applying a continuous layer of uncured photoresist polymer to one surface of the metal base sheet;
h. disposing the mask sheet between the continuous layer of uncured photoresist polymer and the light curing means;
i. exposing the photoresist polymer through the mask means to cure the portions of the photoresist polymer in register with the transparent regions;
j. removing the mask sheet;
k. exposing the base sheet to acid for a sufficient time to define at least one protrusion having an upper surface and a side wall defining a first height on the base sheet;
l. washing away the acid with the caustic;
m. applying photoresist polymer to the upper surface and a side wall of the at least one protrusion;
n. exposing the base sheet to acid for a sufficient time to form additional side wall of the at least one protrusion such that the side wall defines a second height, the second height being greater than the first height; and
o. washing away the acid with caustic.

2. The method of claim 1, wherein steps (m)–(o) of the method is repeated a sufficient number of times to produce a protrusion having a generally vertical side wall, and an aspect ratio of at least about 1.

3. The method of claim 1, where step (m) is accomplished by use of a printing apparatus.

4. The method of claim 3, wherein the printing apparatus is a flexographic printer.

5. The method of claim 1, wherein the forming structure is suitable for use in an apparatus for making formed polymeric film.

6. The method of claim 1, wherein step (g) is achieved via a printing process; steps (h) and (j) are eliminated; and step (i) does not require a mask.

* * * * *